(12) United States Patent
Manley et al.

(10) Patent No.: US 11,654,657 B2
(45) Date of Patent: May 23, 2023

(54) THROUGH GLASS VIA FABRICATION USING A PROTECTIVE MATERIAL

(71) Applicant: Corning Incorporated, Corning, NY (US)

(72) Inventors: Robert George Manley, Vestal, NY (US); Rajesh Vaddi, Corning, NY (US)

(73) Assignee: Corning Incorporated, Corning, NY (US)

( * ) Notice: Subject to any disclaimer, the term of this patent is extended or adjusted under 35 U.S.C. 154(b) by 632 days.

(21) Appl. No.: 16/757,727

(22) PCT Filed: Oct. 24, 2018

(86) PCT No.: PCT/US2018/057203
§ 371 (c)(1),
(2) Date: Apr. 20, 2020

(87) PCT Pub. No.: WO2019/084077
PCT Pub. Date: May 2, 2019

(65) Prior Publication Data
US 2021/0187910 A1 Jun. 24, 2021

Related U.S. Application Data

(60) Provisional application No. 62/578,109, filed on Oct. 27, 2017.

(51) Int. Cl.
*B32B 17/10* (2006.01)
*C03C 23/00* (2006.01)
(Continued)

(52) U.S. Cl.
CPC ............... *B32B 17/10* (2013.01); *B32B 3/26* (2013.01); *B32B 27/06* (2013.01); *B32B 27/281* (2013.01);
(Continued)

(58) Field of Classification Search
CPC .................................................. C03C 23/0025
See application file for complete search history.

(56) References Cited

U.S. PATENT DOCUMENTS 9,105,615 B1 8/2015 Ghali
9,130,016 B2 9/2015 Urruti
(Continued)

FOREIGN PATENT DOCUMENTS

CN 103311455 A 9/2013
CN 107531564 A 1/2018
(Continued)

OTHER PUBLICATIONS

Taiwanese Patent Application No. 107137969, Office Action, dated Mar. 10, 2022, 1 page; Taiwanese Patent Office.
(Continued)

*Primary Examiner* — Ian A Rummel
(74) *Attorney, Agent, or Firm* — Matthew J. Mason

(57) ABSTRACT

A sub-assembly includes a glass substrate, a plurality of electronic devices, and a passivation layer. The glass substrate includes a first surface, a second surface opposite to the first surface, and a third surface extending between the first surface and the second surface. The glass substrate includes a plurality of laser damaged regions extending from the first surface to the second surface. The plurality of electronic devices are on the first surface of the glass substrate. The passivation layer is on the plurality of electronic devices and the third surface of the glass substrate. The passivation layer includes an opening to each laser damaged region of the plurality of laser damaged regions.

20 Claims, 4 Drawing Sheets

(51) Int. Cl.
*C03C 15/00* (2006.01)
*B32B 3/26* (2006.01)
*B32B 27/06* (2006.01)
*B32B 27/28* (2006.01)
*B32B 27/30* (2006.01)
*H01L 21/768* (2006.01)
*C03C 17/00* (2006.01)

(52) U.S. Cl.
CPC ............ *B32B 27/308* (2013.01); *C03C 15/00* (2013.01); *C03C 23/0025* (2013.01); *H01L 21/76814* (2013.01); *B32B 2255/205* (2013.01); *B32B 2307/202* (2013.01); *B32B 2307/732* (2013.01); *B32B 2457/208* (2013.01); *C03C 17/002* (2013.01); *C03C 2203/10* (2013.01)

(56) References Cited

U.S. PATENT DOCUMENTS

| | | |
|---|---|---|
| 9,412,772 B1 | 8/2016 | Ghali |
| 9,629,250 B2 | 4/2017 | Takahashi et al. |
| 2002/0052057 A1 | 5/2002 | Wong |
| 2004/0263742 A1 | 12/2004 | Kim |
| 2005/0025445 A1 | 2/2005 | Schoroeder et al. |
| 2007/0045779 A1 | 3/2007 | Hiatt |
| 2012/0075216 A1 | 3/2012 | Black et al. |
| 2013/0050226 A1 | 2/2013 | Shenoy et al. |
| 2013/0050227 A1 | 2/2013 | Petersen et al. |
| 2013/0050228 A1 | 2/2013 | Petersen et al. |
| 2013/0174417 A1 | 7/2013 | Yu et al. |
| 2013/0247615 A1 | 9/2013 | Boek et al. |
| 2014/0035935 A1 | 2/2014 | Shenoy et al. |
| 2014/0147624 A1 | 5/2014 | Streltsov et al. |
| 2015/0123136 A1 | 5/2015 | Kim et al. |
| 2015/0200207 A1 | 7/2015 | Nozu et al. |
| 2017/0358447 A1 | 12/2017 | Tsunetomo et al. |

FOREIGN PATENT DOCUMENTS

| | | |
|---|---|---|
| JP | 2003-092260 A | 3/2003 |
| JP | 2010-254551 A | 11/2010 |
| TW | 201825903 A | 7/2018 |

OTHER PUBLICATIONS

Chinese Patent Application No. 201880074323.1, Office Action dated Mar. 1, 2022, 4 pages of English Translation, Chinese Patent Office.

Japanese Patent Application No. 2020-523434, Office Action dated Dec. 7, 2022, 2 pages (English translation only), Japanese Patent Office.

International Search Report and Written Opinion of the International Searching Authority; PCT/US2018/057203; dated Jan. 3, 2019; 9 Pages; ISA/US Commissioner for Patents.

THROUGH GLASS VIA FABRICATION USING A PROTECTIVE MATERIAL

CROSS-REFERENCE TO RELATED APPLICATIONS

This application claims the benefit of priority under 35 U.S.C. § 371 of International Application Serial No. PCT/US2018/057203, filed Oct. 24, 2018, which claims the benefit of priority under 35 U.S.C. § 119 of U.S. Provisional Application Ser. No. 62/578,109 filed on Oct. 27, 2017, the contents of both of which are relied upon and incorporated herein by reference in their entirety.

FIELD

The present disclosure relates generally to through glass vias (TGVs). More particularly, it relates to the fabrication of TGVs using protective materials to form electrical signal paths within devices, such as displays.

TECHNICAL BACKGROUND

Glass is a widely used material in multiple electronic applications such as displays, interposers, sensors, etc. Electronic displays may be used in numerous types of devices such as smart phones, tablet computers, automotive electronics, augmented reality devices, and the like. Electronic devices may include vias that extend through the thickness of a glass substrate to transfer electrical signals from one main surface of the glass substrate to the other main surface of the glass substrate. The vias may carry electrical signals and power between circuitry located on top of the glass substrate and circuitry located below the glass substrate.

The fabrication of electronic patterns to form circuitry on a surface of a through glass via (TGV) substrate may include photolithography steps that may result in photoresist entrapment in the TGVs. This photoresist entrapment in the TGVs may be a detriment to the quality of the electronic patterns formed on the surface of the TGV substrate. Accordingly, methods to fabricate electronic patterns on glass substrates including TGVs while preventing photoresist entrapment in the TGVs are disclosed herein.

SUMMARY

Some embodiments of the present disclosure relate to a sub-assembly. The sub-assembly includes a glass substrate, a plurality of electronic devices, and a passivation layer. The glass substrate includes a first surface, a second surface opposite to the first surface, and a third surface extending between the first surface and the second surface. The glass substrate includes a plurality of laser damaged regions extending from the first surface to the second surface. The plurality of electronic devices are on the first surface of the glass substrate. The passivation layer is on the plurality of electronic devices and the third surface of the glass substrate. The passivation layer includes an opening to each laser damaged region of the plurality of laser damaged regions.

Yet other embodiments of the present disclosure relate to a method for fabricating a glass component. The method includes laser damaging a glass substrate to create a plurality of laser damaged regions extending from a first surface of the glass substrate to a second surface of the glass substrate opposite to the first surface. The method further includes fabricating a plurality of electronic devices on the first surface of the glass substrate. The method further includes applying a protective material over the plurality of electronic devices and a third surface of the glass substrate extending between the first surface and the second surface of the glass substrate. The method further includes etching the plurality of laser damaged regions to impart a corresponding plurality of through glass vias.

Yet other embodiments of the present disclosure relate to a method for fabricating a display. The method includes laser damaging a glass substrate to create a plurality of laser damaged regions extending from a first surface of the glass substrate to a second surface of the glass substrate opposite to the first surface. The method further includes fabricating an array of thin-film transistors on the first surface of the glass substrate. The method further includes applying a protective material over the array of thin-film transistors and over a third surface of the glass substrate extending between the first surface and the second surface of the glass substrate. The method further includes etching the plurality of laser damaged regions to impart a corresponding plurality of through glass vias. The method further includes metalizing the plurality of through glass vias to create a corresponding plurality of electrical contacts extending through the glass substrate and coupled to the array of thin-film transistors. The method further includes removing the protective material.

The sub-assemblies and methods disclosed herein enable the use of through glass electrical signal paths to carry electrical signals and/or power from circuitry located on one side of a glass substrate to circuitry located on the other side of the glass substrate while preventing photoresist entrapment in the TGVs.

Additional features and advantages will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate various embodiments described herein, and together with the description serve to explain the principles and operations of the claimed subject matter.

DETAILED DESCRIPTION

Figure 1A:
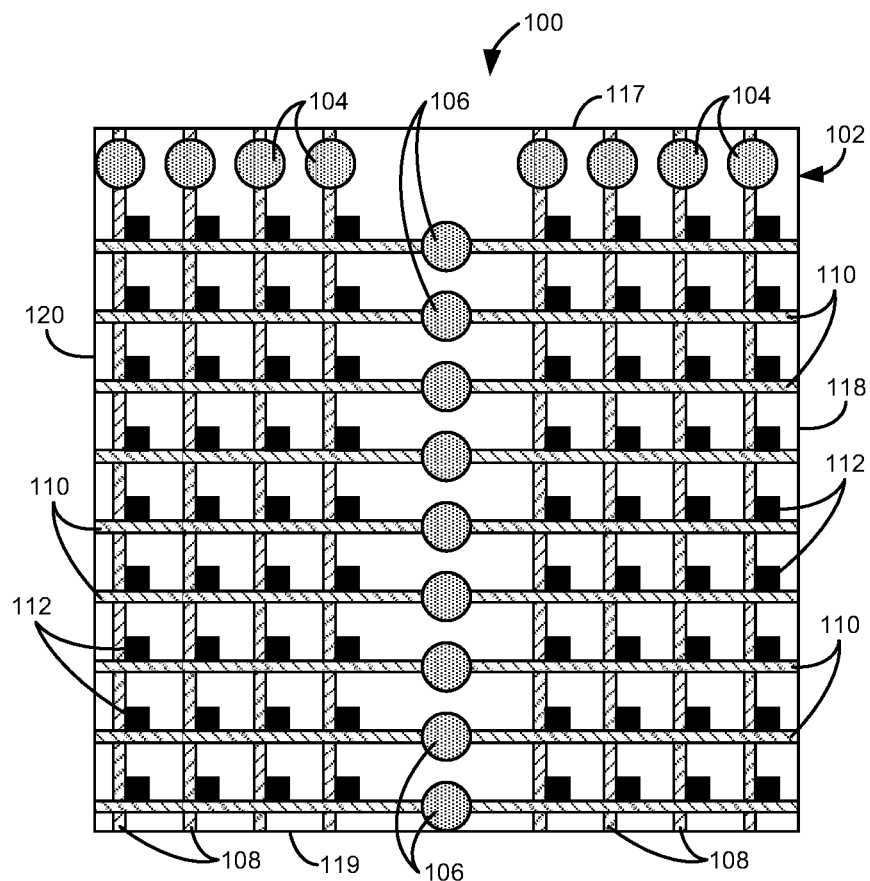
FIGS. 1A-1B schematically depict one example of a display.

Reference will now be made in detail to embodiments of the present disclosure, examples of which are illustrated in the accompanying drawings. Whenever possible, the same reference numerals will be used throughout the drawings to refer to the same or like parts. However, this disclosure may be embodied in many different forms and should not be construed as limited to the embodiments set forth herein.

Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

Directional terms as used herein—for example up, down, right, left, front, back, top, bottom, vertical, horizontal—are made only with reference to the figures as drawn and are not intended to imply absolute orientation.

Unless otherwise expressly stated, it is in no way intended that any method set forth herein be construed as requiring that its steps be performed in a specific order, nor that with any apparatus, specific orientations be required. Accordingly, where a method claim does not actually recite an order to be followed by its steps, or that any apparatus claim does not actually recite an order or orientation to individual components, or it is not otherwise specifically stated in the claims or description that the steps are to be limited to a specific order, or that a specific order or orientation to components of an apparatus is not recited, it is in no way intended that an order or orientation be inferred, in any respect. This holds for any possible non-express basis for interpretation, including: matters of logic with respect to arrangement of steps, operational flow, order of components, or orientation of components; plain meaning derived from grammatical organization or punctuation, and; the number or type of embodiments described in the specification.

As used herein, the singular forms "a," "an," and "the" include plural references unless the context clearly dictates otherwise. Thus, for example, reference to "a" component includes aspects having two or more such components, unless the context clearly indicates otherwise.

Figure 1B:
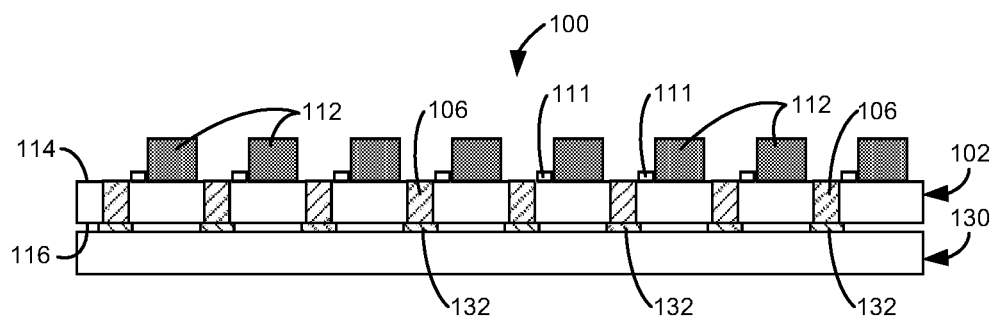

Referring now to FIGS. 1A-1B, an exemplary display 100 is depicted. FIG. 1A illustrates a top view of display 100 and FIG. 1B illustrates a sectional view of display 100. Display 100 includes a glass substrate 102, first metallized through glass vias (TGVs) 104, second metallized TGVs 106, first conductive lines 108, second conductive lines 110, thin-film electronics 111, light sources 112, a control board 130, and electrodes 132. Glass substrate 102 includes a first surface 114 and a second surface 116 opposite to first surface 114. Glass substrate 102 also includes side surfaces 117, 118, 119, and 120 extending between first surface 114 and second surface 116 of glass substrate 102. In one example, first surface 114 is parallel to second surface 116 and side surfaces 117, 118, 119, and 120 are orthogonal to first surface 114 and second surface 116 of glass substrate 102.

Thin-film electronics 111 may be thin-film transistors (TFTs). TFTs 111 are arranged in an array of rows and columns. Each TFT 111 is electrically coupled to a light source 112. Each light source 112 may be a light emitting diode (LED), such as a microLED. MicroLEDs are small (e.g., typically less than about 100 µm by 100 µm) light emitting components. They are inorganic semiconductor components producing high luminance up to about 50 million nits. Therefore, microLEDs are particularly suitable for high resolution displays. Each TFT 111 is electrically coupled to a first conductive line 108 (e.g., via a source or drain of the TFT) and a second conductive line 110 (e.g., via a gate of the TFT). Second conductive lines 110 are arranged over and electrically insulated from first conductive lines 108. In this example, second conductive lines 110 are orthogonal to first conductive lines 108 with first conductive lines 108 extending between side surfaces 117 and 119 of glass substrate 102 and second conductive lines 110 extending between side surfaces 118 and 120 of glass substrate 102. TFTs 111, first conductive lines 108, and second conductive lines 110 are formed on first surface 114 of glass substrate 102. Each light source 112 is arranged on first surface 114 of glass substrate 102 in electrical contact with a TFT 111 (e.g., via a drain or source of the TFT). A planer electrode, not shown, may be applied over and electrically coupled to each light source 112 to provide a common electrode.

Each first conductive line 108 is electrically coupled to a first metallized TGV 104. In this example, metallized TGVs 104 extend through glass substrate 102 in a row adjacent to side surface 117 of glass substrate 102. Each second conductive line 110 is electrically coupled to a second metallized TGV 106. In this example, metallized TGVs 106 extend through glass substrate 102 in a column in the center of glass substrate 102. Each first metallized TGV 104 and each second metallized TGV 106 provides an electrical signal path (e.g., an electrical contact) extending through glass substrate 102. Each first metallized TGV 104 and each second metallized TGV 106 is electrically coupled to control board 130 via an electrode 132 of control board 130. In operation, control board 130 may individually control each TFT 111 to individually control each light source 112.

Figure 2:
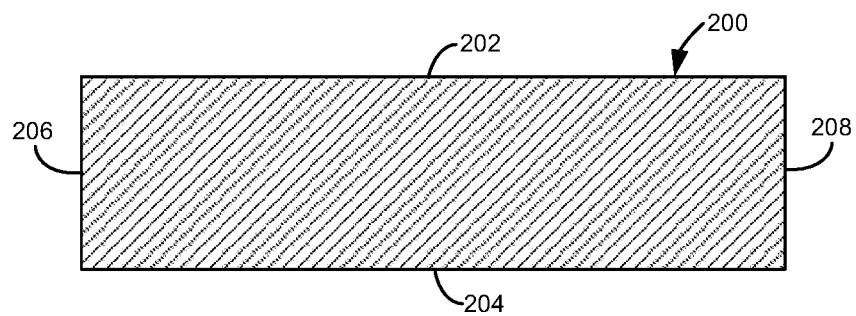
FIG. 2 schematically depicts one example of a glass substrate.

FIG. 2 schematically depicts an exemplary glass substrate 200. Glass substrate 200 includes a first surface 202, a second surface 204 opposite to the first surface, and a third surface 206 extending between the first surface 202 and the second surface 204. Glass substrate 200 may also include a fourth surface 208 extending between the first surface 202 and the second surface 204. In one example, first surface 202 is parallel to second surface 204, and third surface 206 and fourth surface 208 are orthogonal to first surface 202 and second surface 204. Glass substrate 200 may include additional side surfaces extending between first surface 202 and second surface 204. For example, for a rectangular shaped glass substrate, glass substrate 200 may include a fifth surface and a sixth surface extending between first surface 202 and the second surface 204 orthogonal to third surface 206 and fourth surface 208. In other examples, glass substrate 200 may have other suitable shapes with the corresponding number of side surfaces, such as circular, triangular, hexagonal, etc. Glass substrate 200 may have a thickness between first surface 202 and second surface 204 of between about 0.1 mm and 0.63 mm or another suitable thickness.

Figure 3:
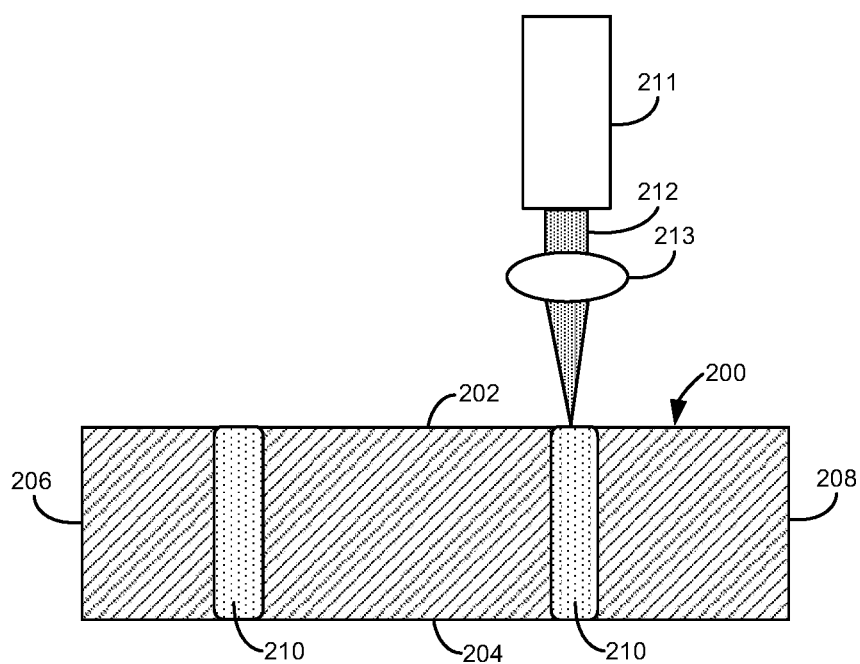
FIG. 3 schematically depicts one example of laser damaging the glass substrate of FIG. 2.

FIG. 3 schematically depicts one example of laser damaging glass substrate 200 of FIG. 2. Glass substrate 200 is damaged via a laser beam 212 generated by a laser 211 to create a plurality of laser damaged regions 210. Each laser damaged region 210 extends from the first surface 202 of glass substrate 200 to the second surface 204 of glass substrate 200. In one example, laser damaged regions 210 include open or hollow micro-channels having a diameter between about 7 µm and 9 µm. In other examples, laser damaged regions 210 include other structures that break or disrupt the crystalline structure of glass substrate 200. In any case, laser damaged regions 210 of glass substrate 200 etch at a faster rate than the non-damaged regions of glass substrate 200.

Laser damaged regions 210 are formed by irradiating first surface 202 of glass substrate 200 with laser beam 212 generated by laser 211. Laser beam 212 may, for example, be focused by a lens 213 to a focal point within about +/−100 µm of first surface 202 of glass substrate 200. In certain exemplary embodiments, lens 213 has a numerical aperture within a range between about 0.1 and 0.4 for a glass substrate 200 thickness within a range between about 0.1 mm and 0.63 mm. Laser 211 may be operated at a repetition rate of about 50 kHz or below and of a sufficient irradiation duration to extend laser damaged regions 210 to second surface 204 of glass substrate 200.

In certain exemplary embodiments, laser 211 is a carbon dioxide laser generating a laser beam 212 with a wavelength between about 9 µm and 10.2 µm. In another example, laser 211 is an ultraviolet (UV) laser generating a UV laser beam 212 with a wavelength between about 300 nm and 400 nm, such as about 355 nm (e.g., a Neodymium doped Potassium-Gadolinium Tungstate or another Nd-doped laser). Laser 211 may, for example, irradiate first surface 202 of glass substrate 200 for a duration within a range from about 8 to 150 milliseconds per laser damaged region 210. The specific duration of the irradiation per laser damaged region 210 depends on the thickness of glass substrate 200.

Laser damaged regions 210 prepare glass substrate 200 for a later etching process as will be described below while maintaining the dimensional stability of glass substrate 200 for the fabrication of electronic devices on the glass substrate 200. At the same time, since the TGVs are not yet fully formed prior to fabricating the electronic devices, photoresist entrapment in TGVs due to photolithography processes is prevented.

Figure 4:
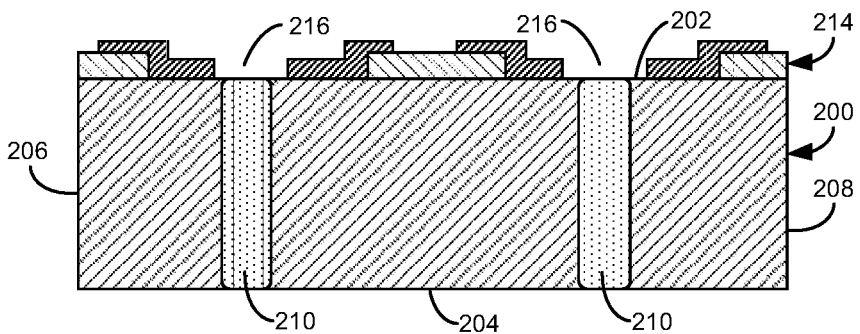
FIG. 4 schematically depicts one example of forming electronic devices on the top surface of the glass substrate of FIG. 3.

FIG. 4 schematically depicts one example of forming electronic devices 214 on the surface of the glass substrate 200 of FIG. 3. Electronic devices 214 are fabricated on the first surface 202 of glass substrate 200. In certain exemplary embodiments, electronic devices 214 include thin-film electronic devices, such as TFTs. Electronic devices 214 may be fabricated using photolithography processes to form conductive and/or dielectric portions of the electronic devices. For example, electronic devices 214 may include first conductive lines 108, second conductive lines 110, and TFTs 111 previously described and illustrated with reference to FIGS. 1A-1B. Electronic devices 214 are referenced to laser damaged regions 210 such that openings 216 remain between electronic devices 214 exposing laser damaged regions 210. In another example, electronic devices 214 may be fabricated on the glass substrate 200 of FIG. 2 prior to the formation of laser damaged regions 210 as described with reference to FIG. 3.

Figure 5A:
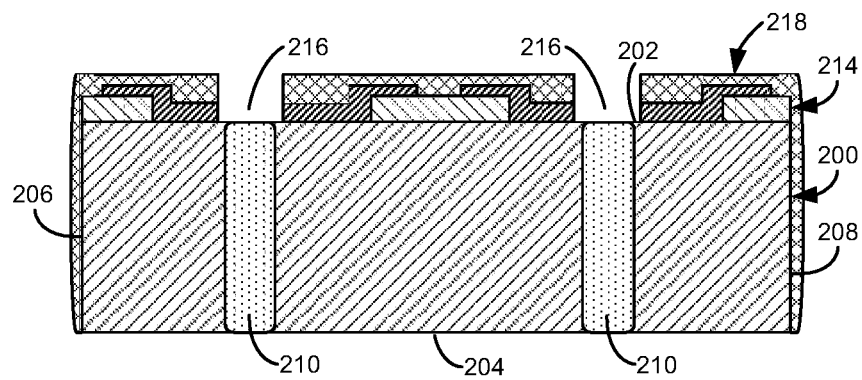
FIGS. 5A-5B schematically depict examples of sub-assemblies after applying a protective material layer over the electronic devices and the glass substrate of FIG. 4.

FIG. 5A schematically depicts an exemplary sub-assembly after applying a protective material layer 218 (e.g., a passivation layer) over the electronic devices 214 and glass substrate 200. A protective material layer 218 is applied over electronic devices 214, first surface 202 of glass substrate 200, and the side surfaces of glass substrate 200 including the third surface 206 and the fourth surface 208 of glass substrate 200. Protective material layer 218 is deposited onto electronic devices 214 and glass substrate 200 using physical vapor deposition (PVD) or another suitable deposition process. In certain exemplary embodiments, a masking process is used during the deposition process to maintain openings 216 exposing laser damaged regions 210. In another example, the protective material over laser damaged regions 210 is removed after the deposition process to create openings 216. Protective material layer 218 may, for example, include a resin material, a polyimide material, an acrylic material, an inorganic material, or another suitable passivation material. Protective material layer 218 may have a thickness within a range between about 1 µm and 50 µm. Protective material layer 218 has a suitable acid durability and a suitable thermal stability within a range from about 100° C. to 300° C.

Protective material layer 218 protects electronic devices 214 and the side surfaces of glass substrate 200 including third surface 206 and fourth surface 208 during the etching of laser damages regions 210 as will be described below. For example, during the fabrication of display device 100 previously described and illustrated with reference to FIGS. 1A-1B, first conductive lines 108, second conductive lines 110, TFTs 111, and side surfaces 117, 118, 119, and 120 of glass substrate 102 may be covered by a protective material layer prior to etching laser damaged regions to provide TGVs that are then filled to provide first metallized TGVs 104 and second metallized TGVs 106. By protecting the side surfaces of glass substrate 200, lateral etching of the side surfaces is prevented and therefore the quality of the electronic devices 214 near the side surfaces is maintained for bezel-less displays, such as displays utilizing microLEDs.

Figure 5B:
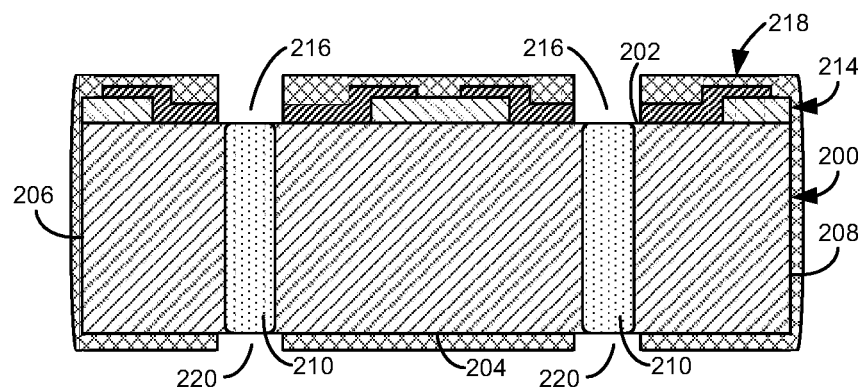

FIG. 5B schematically depicts another example of a sub-assembly after applying a protective layer 218 over electronic devices 214 and glass substrate 200. This example is similar to the example illustrated in FIG. 5A, except that in this example, the protective material layer 214 is also deposited over the second surface 204 of glass substrate 200. In certain exemplary embodiments, a masking process is used during the deposition process to create openings 220 exposing laser damaged regions 210 at the second surface 204 of glass substrate 200. In another example, the protective material below laser damaged regions 210 is removed after the deposition process to create openings 220.

Figure 6:
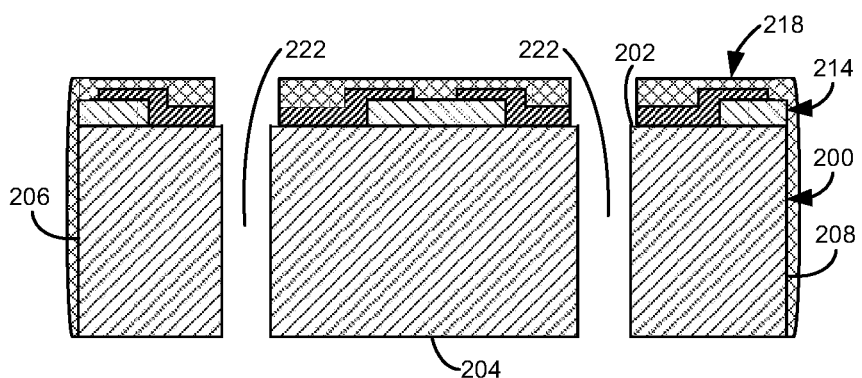
FIG. 6 schematically depicts one example of the sub-assembly of FIG. 5A after forming through glass vias (TGVs)

FIG. 6 schematically depicts an exemplary embodiment of the sub-assembly of FIG. 5A after forming TGVs 222. Laser damaged regions 210 are etched to provide TGVs 222. In certain exemplary embodiments, a wet etch (e.g., acid bath) is used to etch laser damaged regions 210. Wet etching may, for example, include a solution of Hydrogen Fluoride and Nitric Acid (e.g., 20% HF+10% $HNO_3$ by volume solution in water). The etch rates may be modulated based on the temperature and concentrations of the etch bath. The etching parameters (e.g., acid concentrations, etchant recipe, duration of etching, temperature of the solution) determine the diameter and shape of TGVs 222. In this example, the etching parameters are selected to provide substantially cylindrical TGVs 222. TGVs 222 may, for example, have a diameter between about 25 µm and 100 µm. In other examples, a spray etch or dry etch may be used to etch laser damaged regions 210.

Figure 7:
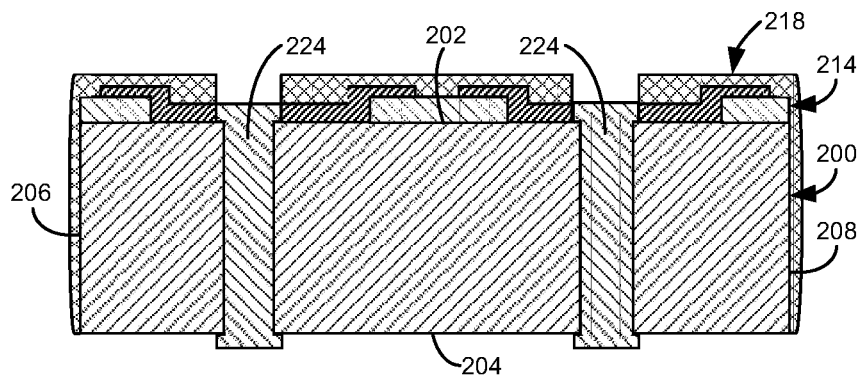
FIG. 7 schematically depicts one example of the subassembly of FIG. 6 after metallizing the TGVs.

FIG. 7 schematically depicts an exemplary embodiment of the sub-assembly of FIG. 6 after metallizing the TGVs 222. TGVs 222 are metallized to provide metallized TGVs 224 extending from the first surface 202 of glass substrate 200 to the second surface 204 of glass substrate 200. Metallized TGVs 224 provide electrical signal paths (e.g., electrical contacts) coupled to electronic devices 214. In certain exemplary embodiments, TGVs 222 are metallized by depositing a conformal copper seed layer using metal-organic chemical vapor deposition (MOCVD) in preparation for TGV plating. The seed layers may, for example, be deposited to a thickness of about 0.75 µm throughout TGVs 222. Electroplating of Cu may then be used to fully fill TGVs 222 to provide metallized TGVs 224. In other examples, TGVs 222 may be filled with a conductive material other than Cu via electroplating or another suitable process.

Figure 8:
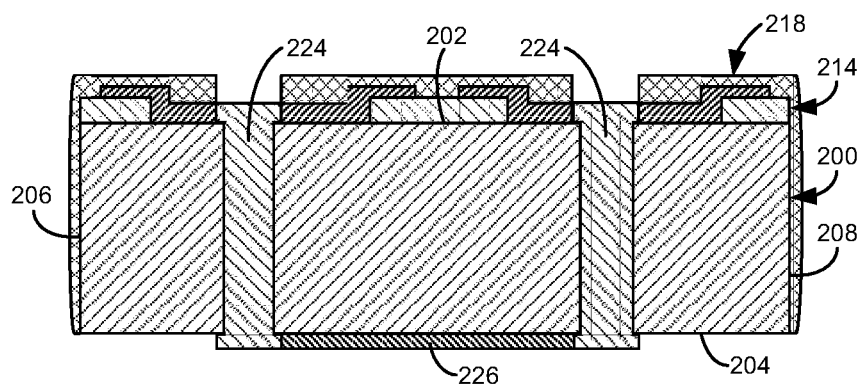
FIG. 8 schematically depicts one example of the subassembly of FIG. 7 after forming electronic devices on the bottom surface of the glass substrate.

FIG. 8 schematically depicts an exemplary embodiment of the sub-assembly of FIG. 7 after forming electronic devices 226 on the second surface 204 of glass substrate 200. Electronic devices 226 may, for example, include conductive lines electrically coupling metallized TGVs 224 to each other, thin-film electronics, or other suitable electronic devices. In other examples, electronic devices 226 may be excluded.

Figure 9:
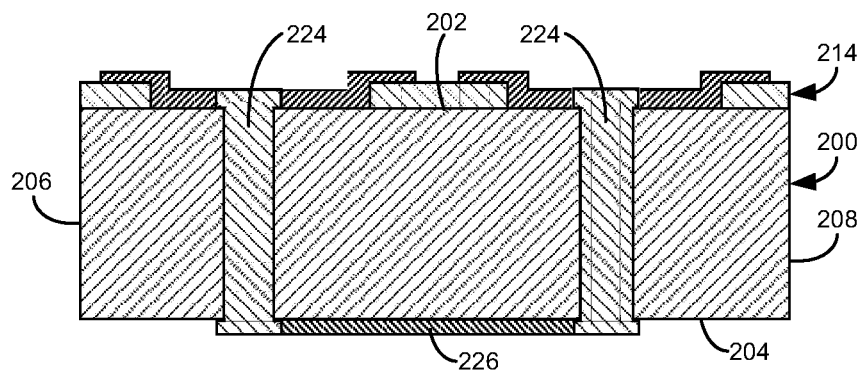
FIG. 9 schematically depicts one example of the subassembly of FIG. 8 after removing the protective material layer.

FIG. 9 schematically depicts an exemplary embodiment of the sub-assembly of FIG. 8 after removing protective material layer 218. Protective material layer 218 can, for example, be removed using an etching process or another suitable process to expose electronic devices 214 and the side surfaces of glass substrate 200 including third surface 206 and fourth surface 208 of glass substrate 200. In certain exemplary embodiments, the sub-assembly of FIG. 9 may be used as a glass component, such as an interposer, of an electronic device. In another example, light sources may be electrically coupled to each electronic device 214 and each metallized TGV 224 may be electrically coupled to a control board to provide a display device, such as display device 100 of FIGS. 1A-1B.

It will be apparent to those skilled in the art that various modifications and variations can be made to embodiments of the present disclosure without departing from the spirit and scope of the disclosure. Thus it is intended that the present disclosure cover such modifications and variations provided they come within the scope of the appended claims and their equivalents.

What is claimed is:

1. A sub-assembly comprising:
a glass substrate comprising a first surface, a second surface opposite to the first surface, and a third surface extending between the first surface and the second surface, the glass substrate comprising a plurality of laser damaged regions extending from the first surface to the second surface;
a plurality of electronic devices on the first surface of the glass substrate; and
a passivation layer on the plurality of electronic devices and the third surface of the glass substrate, the passivation layer comprising an opening to each laser damaged region of the plurality of laser damaged regions.

2. The sub-assembly of claim 1, wherein the passivation layer is on the second surface of the glass substrate.

3. The sub-assembly of claim 1, wherein the plurality of laser damaged regions are configured to be etched to impart a plurality of corresponding through glass vias.

4. The sub-assembly of claim 1, wherein the passivation layer comprises one of a resin material, a polyimide material, an acrylic material, and an inorganic material.

5. The sub-assembly of claim 1, wherein the passivation layer has a thickness between 1 µm and 50 µm.

6. The sub-assembly of claim 1, wherein the plurality of electronic devices comprises a plurality of thin-film electronic devices.

7. The sub-assembly of claim 1, further comprising:
a plurality of electronic devices on the second surface of the glass substrate.

8. A method for fabricating a glass component, the method comprising:
laser damaging a glass substrate to create a plurality of laser damaged regions extending from a first surface of the glass substrate to a second surface of the glass substrate opposite to the first surface;
fabricating a plurality of electronic devices on the first surface of the glass substrate;
applying a protective material over the plurality of electronic devices and a third surface of the glass substrate extending between the first surface and the second surface of the glass substrate; and
etching the plurality of laser damaged regions to impart a corresponding plurality of through glass vias.

9. The method of claim 8, further comprising:
metalizing the plurality of through glass vias to create a corresponding plurality of electrical signal paths extending from the first surface to the second surface of the glass substrate.

10. The method of claim 9, further comprising:
removing the protective material.

11. The method of claim 8, wherein etching the plurality of laser damaged regions comprises wet etching the plurality of laser damaged regions.

12. The method of claim 8, further comprising:
fabricating a plurality of electronic devices on the second surface of the glass substrate.

13. The method of claim 8, where laser damaging the glass substrate precedes fabricating the plurality of electronic devices on the first surface of the glass substrate.

14. The method of claim 8, wherein applying the protective material comprises applying one of a resin material, a polyimide material, an acrylic material, and an inorganic material.

15. The method of claim 8, wherein applying the protective material comprises applying the protective material to a thickness between 1 µm and 50 µm.

16. The method of claim 8, wherein laser damaging the glass substrate comprises irradiating the glass substrate with a carbon dioxide laser with a wavelength between 9 µm and 10.2 µm.

17. The method of claim 8, wherein laser damaging the glass substrate comprises irradiating the glass substrate with an ultraviolet laser with a wavelength between 300 nm and 400 nm.

18. A method for fabricating a display, the method comprising:
laser damaging a glass substrate to create a plurality of laser damaged regions extending from a first surface of the glass substrate to a second surface of the glass substrate opposite to the first surface;
fabricating an array of thin-film transistors on the first surface of the glass substrate;
applying a protective material over the array of thin-film transistors and over a third surface of the glass substrate extending between the first surface and the second surface of the glass substrate;
etching the plurality of laser damaged regions to impart a corresponding plurality of through glass vias;

metalizing the plurality of through glass vias to create a corresponding plurality of electrical contacts extending through the glass substrate and coupled to the array of thin-film transistors; and removing the protective material.

19. The method of claim 18, further comprising:

electrically coupling each electrical contact to a control board.

20. The method of claim 18, further comprising:

electrically coupling a light source to each thin-film transistor of the array of thin-film transistors.

* * * * *